United States Patent [19]
Wright

[11] Patent Number: 5,915,756
[45] Date of Patent: Jun. 29, 1999

[54] METHOD TO FILL VIA HOLES BETWEEN TWO CONDUCTIVE LAYERS

[75] Inventor: Peter Wright, Sunnyvale, Calif.

[73] Assignee: Altera Corporation, San Jose, Calif.

[21] Appl. No.: 08/702,369

[22] Filed: Aug. 22, 1996

[51] Int. Cl.⁶ .................................................. H05K 3/42
[52] U.S. Cl. ................................. 29/852; 29/847; 29/853; 427/97
[58] Field of Search ............................ 29/852, 853, 847, 29/830; 427/96, 97

[56] References Cited

U.S. PATENT DOCUMENTS

| | | | |
|---|---|---|---|
| 4,024,629 | 5/1977 | Lemoine et al. | 29/852 |
| 4,715,117 | 12/1987 | Enomoto | 29/852 X |
| 4,780,957 | 11/1988 | Shiga et al. | 29/852 X |
| 4,908,940 | 3/1990 | Amano et al. | 427/97 X |

FOREIGN PATENT DOCUMENTS

| | | | |
|---|---|---|---|
| 4139790 | 5/1992 | Japan | 29/852 |
| 4139791 | 5/1992 | Japan | 29/852 |
| 5110254 | 4/1993 | Japan | 29/852 |

OTHER PUBLICATIONS

Anthony "Forming electrical interconnections through semiconductor wafers" J. Appl. Phys. 52(8) Aug. 1981, pp. 5340–5349.

"SMT Far–Blind Via–To–Pad–Connection" IBM Tech. Disclosure Bulletin, vol. 35, No. 7, Dec. 1992, pp. 266–267.

"Tungsten Cap Metallization for 0.5 $\mu$m Via Fill Technology," Woo, et. al., *J. Electrochem Soc.*, vol. 142, No. 11, Nov. 1995, © The Electrochemical Society, Inc., pp. 3893–3895.

"Application of Force Fill Al–Plug Technology to 64Mb DRAM and 0.35 $\mu$m Logic," Mizobuchi, et al., *1995 Symposium on VLSI Technology Digest of Technical Papers*, Jun. 6–8, 1995, The Japan Society of Applied Physics/The IEEE Electron Devices Society, pp. 45–46.

"Conventional Approach to Via Fabrication and Formation of Metal–to–Metal Contacts through Vias," *Silicon Processing for the VLSI Era—vol. II: Process Integration*, Wolf, 1990, Lattice Press, Sunset Beach, Ca, pp. 240–259.

*Primary Examiner*—Peter Vo
*Attorney, Agent, or Firm*—Townsend and Townsend and Crew LLP

[57] ABSTRACT

A method of filling via holes between a lower conductive layer and an upper conductive layer whereby the hole is filled by the lower conductive layer. By optimizing conditions such as compressive stress and temperature during the deposition of the various layers, the method of the present invention ensures that at a predefined temperature, compressive force on the lower conductive layer causes hillocks to form inside the via holes.

10 Claims, 2 Drawing Sheets

METHOD TO FILL VIA HOLES BETWEEN TWO CONDUCTIVE LAYERS

BACKGROUND OF THE INVENTION

The present invention relates in general to interconnect structures in electronic circuitry, and in particular to a method of filling via holes between two conductive layers using the underlying conductive layer.

In semiconductor processing and certain types of printed circuit boards, vias are used to provide electrical connection between two conductive layers such as metal that are separated by a layer of insulating material (inter-layer dielectric, ILD). Typically, a film containing a conductive layer such as aluminum is deposited on a substrate. After a step of patterning the first layer, an insulating film (ILD) is formed on top of the first conductive layer. Via holes are then opened to expose the underlying first layer in desired locations. The second conductive layer is then deposited on top of the insulating layer, filling the vias to make electrical contact with the first conductive layer.

There are problems associated with conventional methods of filling via holes. In semiconductor processing, for example, the second conductive layer, typically aluminum (Al) is commonly deposited on top of the insulating material by a sputtering step. The second aluminum layer tends to form in a non-uniform fashion around the via hole as it is sputtered over the via opening. FIG. 1A demonstrates the typical shape that results from the sputtering action. Shadowing causes metal thickness to thin at the bottom edges and sides of the via hole. This type of non-uniform step coverage is exaggerated for smaller geometries where the via hole has higher aspect ratio. FIG. 1B illustrates the type of defect that may arise as a result of this process. The sputtering action may cause a gap inside the via hole, failing to provide an electrical contact between the two conductive layers.

The step coverage problem associated with sputtered metal can be improved by sloping the sidewalls of the via. Vias with sloped sidewalls, however, take more area compared to vias with straight sidewalls. Further, straight sidewalls are easier to form using conventional dry etching processes than sloped sidewalls.

Increasing deposition temperatures has shown to improve the step coverage. Deposition at higher temperatures yields a more uniform thickness over the via due to surface migration of the atoms and their tendency to rearrange themselves in a more uniform fashion. The coverage, however, remains a problem as the dimensions get smaller and the aspect ratios get larger.

Improvements in via process technology have been developed that use tungsten (W) in combination with various other steps to plug the via hole. The resulting structure shows good conformal coverage of the topography. The tungsten plug process, however, tends to be more complex and involves more steps. Because tungsten does not adhere well to the oxide insulating layer, it has been necessary to use a thin film of, for example, titanium nitride (TiN) that is deposited first to act as a "glue" layer between the tungsten and the insulating layer. FIG. 2 illustrates a tungsten plugged via using TiN glue layer. In addition to the added processing steps, the resulting via resistance is increased.

As the ever shrinking feature sizes head into the submicron regime and the aspect ratio of via holes increases, fabricating the optimum via structure becomes more challenging. There is a need for a cost effective and efficient method of filling via holes.

SUMMARY OF THE INVENTION

The present invention provides a method of filling via holes between a lower conductive layer and an upper conductive layer whereby the hole is filled by the lower conductive layer. By optimizing conditions such as compressive stress and temperature during the deposition of the various layers, the method of the present invention ensures that at a defined temperature, compressive force on the lower conductive layer causes hillocks to form inside the via holes. The factors that control the formation of the hillock can be adjusted for any size via hole eliminating the aspect-ratio dependency of via fabrication.

Accordingly, the present invention provides a method of filling a via hole that includes the steps of (a) depositing a first electrically conductive layer on a substrate, (b) patterning the first electrically conductive layer by removing undesired portions thereof, (c) depositing a compressive insulating layer over the first electrically conductive layer, (d) opening via holes in the insulating layer, (e) heating the substrate to a predefined temperature to cause the first electrically conductive layer to form hillocks filling the via holes, and (f) depositing a second electrically conductive layer over the insulating layer to form electrical contact between the first and the second electrically conductive layers through the via holes.

A better understanding of the nature and advantages of the method of the present invention may be had with reference to the drawings and detailed description below.

DESCRIPTION OF THE PREFERRED EMBODIMENT

To avoid problems arising from non-uniform step coverage when filling a high aspect ratio via hole, the method of the present invention allows the lower conductive layer to fill the via hole. This is accomplished by optimizing the temperature and compressive stress factors when depositing the conductive and insulating layers such that at a predefined temperature the lower conductive layer forms hillocks filling the via holes. The various steps of the method of the present invention will be described in greater detail hereinafter in connection with semiconductor processing. It is to be understood, however, that the method of the present invention is applicable in printed circuit board technology as well.

Figure 1A:
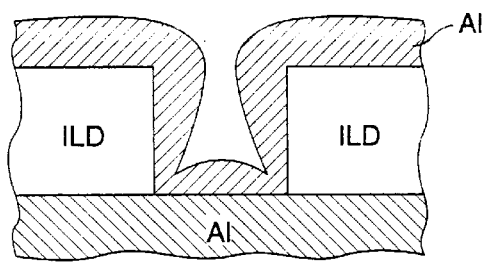
FIGS. 1A and 1B illustrate profile of a via hole filled by conventional sputtering techniques and the associated potential step coverage problem.
Figure 1B:
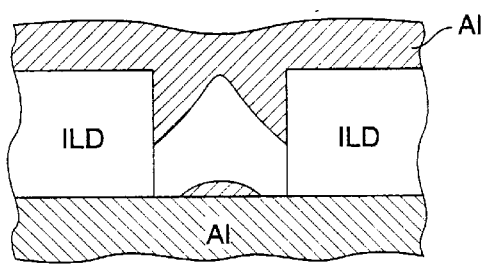
Figure 2:
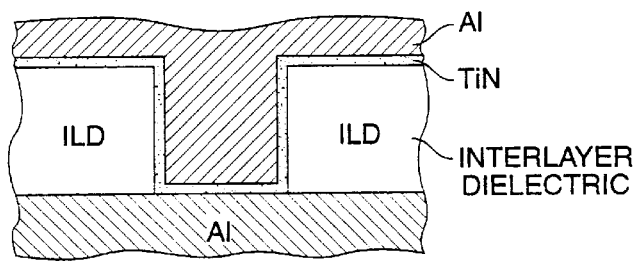
FIG. 2 shows a tungsten plugged via using a TiN glue layer.
Figure 3A:
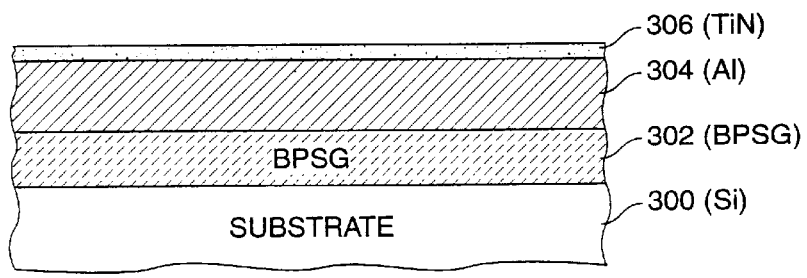
FIGS. 3A, 3B, 3C, and 3D show the filling of a via hole by the lower level conductive layer by inducing the formation of a hillock according the method of the present invention.

Referring to FIG. 3A, starting from silicon substrate 300, first an insulating layer such as Boro-Phospho-Silican-Glass (BPSG) 302 is grown or deposited on the surface of substrate 300. Insulating layer 302 may have connections to conducting regions in or above the substrate. The next step involves depositing a first electrically conductive layer 304 on BPSG layer 302. First electrically conductive layer 304 is preferably made of a conductive material with relatively low melting temperature such as aluminum or aluminum compounds. Depending on the dimensions of the via hole and other process parameters, first conductive layer 304 is preferably under compressive stress of, for example, $5\times10^9$ dyne/cm$^2$. Electrical interconnects are next patterned into first conductive layer 304 using conventional technology such as dry or wet etching techniques. Because aluminum is shiny, when aluminum is used as the first conductive layer, it is preferable to cover the aluminum with a thin coating of another conductive layer 306 made up of anti-reflective material such as titanium nitride (TiN). This enhances the resolution of the patterns by reducing the amount of light interference. In some instances, the aluminum layer may be sandwiched on both sides by a thin layer of a material such as TiN. The TiN layer may also be under compressive stress.

After the interconnection pattern is formed in first conductive layer 304/306, a thick compressive insulating layer 308 is formed over the first conductive layer. Insulating materials such as silicon oxide or Silicon Oxide Glass (SOG) may be used for insulating layer 308. A via hole 310 is then opened in insulating layer 308 using, for example, a dry or wet etch process. With current state of the art, typical dimensions for a via may be, for example, 0.5–1.5 μm in height and 0.2–1.5 μm in width.

Figure 3B:
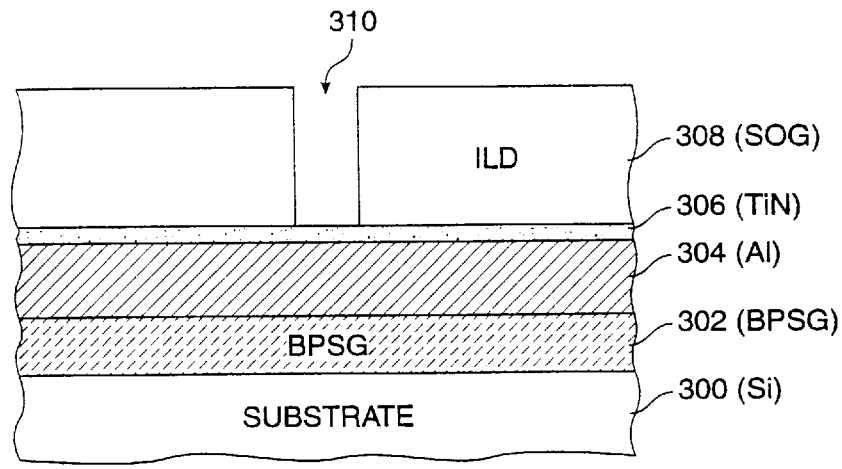

Next, substrate 300 is heated to at least the temperature at which the metal starts to recrystallize. In the case of aluminum this would be above 400° C. Referring to FIG. 3B, the compressive force on first conductive layer 304 under the high temperature causes a hillock 312 to be formed in the via hole. The speed at which the via hole is filled and the extent of extrusion are governed by the size of the via hole, the amount of compressive stress, and temperature.

Figure 3C:
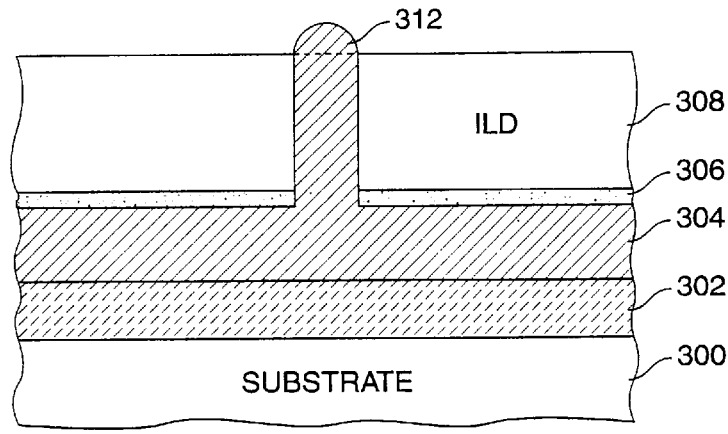
Figure 3D:
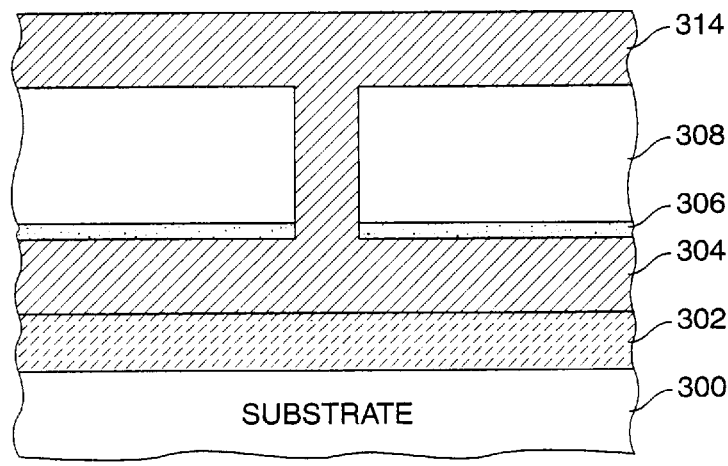

Any excess aluminum above the top of insulating film 308 can be removed with a technique such as chemical-mechanical polishing. A second conductive layer 314 is then deposited over the planarized surface as shown in FIG. 3C. Contact between the first and the second conductive layers are made by the filled vias.

Thus, a high aspect ratio does not adversely impact the integrity of a via filled according to the method of the present invention. By controlling the amount of compressive stress and temperature, the method ensures that the via hole is filled by the extruding lower conductive layer. In addition to the advantage of scalabilty, the method of the present invention yields low resistance vias since the via may be filled exclusively by a low resistance material such as aluminum. The method is also inexpensive as it does not require additional steps that add to the complexity of the process.

In conclusion, the present invention provides a method of filling via holes whereby a lower conductive layer under compressive stress is heated to form hillocks through via holes. While the above is a complete description of the preferred embodiment of the present invention, it is possible to use various alternatives, modifications and equivalents. For example, the step of heating the substrate to form hillocks can be performed after a second conductive layer is deposited over insulating layer 308. In that case, hillock forming from first conductive layer 304 fuse with material from second conductive layer in one step. Also, other materials such as gallium arsenide may be used in the method of the present invention with gold interconnects. Therefore, the scope of the present invention should be determined not with reference to the above description but should, instead, be determined with reference to the appended claims, along with their full scope of equivalents.

What is claimed is:

1. A method of filling via holes in semiconductor technology, comprising the steps of:
   forming a first insulating layer on a silicon substrate;
   forming a first electrically conductive layer on said first insulating layer;
   patterning said first electrically conductive layer;
   forming a compressive insulating layer over the patterned first electrically conductive layer;
   opening a via hole in said insulating layer;
   heating said substrate to a predefined temperature to cause said first electrically conductive layer to form hillocks thereby substantially filling said via hole with said first electrically conductive layer; and
   forming a second electrically conductive layer over said compressive insulating layer to form electrical contact between said first and said second electrically conductive layers through said via holes.

2. The method of filling a via hole as in claim 1 further comprising a step of planarizing a surface of said compressive insulating layer by removing an excess amount of said extruding material, after said heating step and before said step of forming said second electrically conductive layer.

3. The method of filling a via hole as in claim 2 wherein said first electrically conductive layer is formed under compressive stress of about $5 \times 10^9$ dyne/cm2.

4. The method of filling a via hole as in claim 2 wherein said first electrically conductive layer is formed under compressive stress.

5. The method of filling a via hole as in claim 3 wherein said first electrically conductive layer comprises aluminum.

6. The method of filling a via hole as in claim 5 wherein said first electrically conductive layer further comprises a thin film of anti-reflective conductive layer on top of said aluminum.

7. The method of filling a via hole as in claim 6 wherein said anti-reflective conductive layer comprises Titanium Nitride.

8. The method of filling a via hole as in claim 7 wherein said predetermined temperature in said step of heating is at least a temperature at which said first electrically conductive layer starts to recrystallize.

9. The method of filling a via hole as in claim 8 wherein said predetermined temperature is at least 400 degrees centigrade.

10. A semiconductor process comprising the steps of:
    forming a first layer of insulating material on a silicon substrate;
    depositing a first layer of conductive material comprising aluminum on said first layer of insulating material, said first layer of conductive material being deposited under compressive stress;
    patterning said first layer of conductive material;
    forming a compressive layer of insulating material over the patterned first layer of conductive material;
    etching a via hole in said compressive layer of insulating material;
    heating said silicon substrate to at least a temperature at which said first layer of conductive material starts to recrystalize and forms hillocks inside said via hole, thereby substantially filling said via hole with said first layer of conductive material;
    planarizing a surface of said insulating layer by removing excess amounts of said first layer of conductive material thereby forming a planarized surface; and
    depositing a second layer of conductive material over the planarized surface of said insulating layer, whereby electrical contact between said first layer of conductive material and said second layer of conductive material is made through said via.

* * * * *